United States Patent
Lien

(10) Patent No.: US 7,074,651 B2
(45) Date of Patent: Jul. 11, 2006

(54) PACKAGING METHOD FOR INTEGRATED CIRCUITS

(75) Inventor: Jeffrey Lien, Taipei (TW)

(73) Assignee: Optimum Care International Tech. Inc., Taipei (TW)

( * ) Notice: Subject to any disclaimer, the term of this patent is extended or adjusted under 35 U.S.C. 154(b) by 0 days.

(21) Appl. No.: 10/959,202

(22) Filed: Oct. 7, 2004

(65) Prior Publication Data

US 2005/0227414 A1 Oct. 13, 2005

(30) Foreign Application Priority Data

Apr. 7, 2004 (TW) .............................. 93109595 A

(51) Int. Cl.
*H01L 21/44* (2006.01)

(52) U.S. Cl. ..................................... 438/112; 438/464

(58) Field of Classification Search ............... 438/106, 438/108, 110–114, 127, 197, 199, 206, 212, 438/231–232, 234, 262, 299, 301, 305–306, 438/455, 458–460, 464–465, 584, 586, 588, 438/597–599, 612, 618, 622, 229
See application file for complete search history.

(56) References Cited

U.S. PATENT DOCUMENTS

| 5,250,843 | A * | 10/1993 | Eichelberger | 257/692 |
| 6,342,434 | B1 * | 1/2002 | Miyamoto et al. | 438/464 |
| 6,419,746 | B1 * | 7/2002 | Banno et al. | 118/323 |
| 6,503,831 | B1 * | 1/2003 | Speakman | 438/674 |
| 2004/0113283 | A1 * | 6/2004 | Farnworth et al. | 257/782 |
| 2004/0188864 | A1 * | 9/2004 | Boon et al. | 257/796 |

* cited by examiner

*Primary Examiner*—Michael Lebentritt
*Assistant Examiner*—Andre' C. Stevenson
(74) *Attorney, Agent, or Firm*—Troxell Law Office, PLLC

(57) ABSTRACT

A packaging method for integrated circuits comprising processes such as wafer grinding, wafer mount, wafer saw, die attach, etc., multiple singulated chips are each attached and assembled to leadframe unit, the leadframe unit is used as electrical out-connecting component for each chip, and the wire-bonding part of the chip is dispensed continuously with encapsulant material to seal, curing method is further applied to solidify the encapsulant, then saw or punching method is used to dice apart each chip accompanied with leadframe unit (singulation process), a ready-to-use integrated circuit is thus obtained, such manufacturing processes let the goals of easy-to-manufacture, fast production and lowered-production cost be easily achieved for the packaging and singulating processes.

3 Claims, 6 Drawing Sheets

PACKAGING METHOD FOR INTEGRATED CIRCUITS

BACKGROUND OF THE INVENTION

1. Field of the Invention

This invention relates to a packaging method for integrated circuits, it more specifically relates to an integrated circuit packaging method and design comprising methods and processes such as assembly of chip and leadframe, wire-bonding, globtopping, curing, and singulation.

2. Description of the Related Art

The prior art integrated circuit structure is as shown in FIG. 1, a singulated chip 10 is attached to leadframe unit 20, wherein said leadframe unit 20 comprising of multiple rows of leads 201, at the selected surface of leads 201 and chip 10 is wire-bonded with wire 30, leads 201 are used as the out-connecting components for chip 10; since wire 30 is very delicate, it is commonly sealed through packaging method in the prior art to prevent its damage from external forces, that is, mold is used to enclose chip 10 and leadframe unit 20, then insulating encapsulant is injected into the mold such that an encapsulated body 40 is formed to enclose chip 10 and leadframe unit 20 ; furthermore, as shown in FIG. 2, the packaged integrated circuit is singulated to separate the chip for use by other end users.

In the prior art packaging method, Transfer Molding method has to be used, therefore, multiple types and sizes of mold have to be prepared, the packaging cost thus can not be lowered, and too many molds could also cause QC troubles; furthermore, when the mold enclose chip 10 and leadframe 20, the gaps among leads 201 are not blocked, therefore, when encapsulant is injected under high pressure, encapsulant usually overflows outside leadframe 20, this could cause defect in the packaged product; if any stop component is used to stop the overflow of encapsulant among leads 201, it would be technically very difficult since leads 201 of leadframe unit 20 are very delicate, not only a lot of trouble could be encountered in the process, it could also bring damage to leads 201. Moreover, in the prior art, integrated circuit is singulated to separate (to exclude leadframe and other junk material), therefore, only one by one dicing can be performed (please refer to FIG. 2), and the efficiency during mass production is thus reduced.

SUMMARY OF THE INVENTION

The main purpose of this invention is to provide a packaging method and design for integrated circuit, it is an integrated circuit packaging method and design comprising methods and processes such as assembly of chip and leadframe, wire-bonding, globtopping, curing, and singulation, the goals of easy manufacturing processes, fast production, lowering production cost, easy-to-control integrated circuit quality, suitability for mass production, etc.

To achieve the above-mentioned goals, this invention is embodied through processes such as: wafer grinding, wafer mount, wafer saw, dice attach and wire-bonding, multiple singulated die (chips) are each attached and assembled to leadframe unit of the leadframe, multiple leads of the leadframe unit is used as electrical out-connecting component for each chip, and the wire-bonding part of the chip is dispensed continuously with encapsulant material to seal, curing method is further applied to solidify the encapsulant, then saw or punching method is used to dice apart each chip accompanied with leadframe unit (singulation process), a ready to use integrated circuit is thus obtained, such manufacturing processes let the goals of easy to manufacture, fast production, lowered production cost, easy-to-control integrated circuit quality, suitability for mass production, etc. be easily achieved.

DETAILED DESCRIPTION OF THE INVENTION

Figure 1:
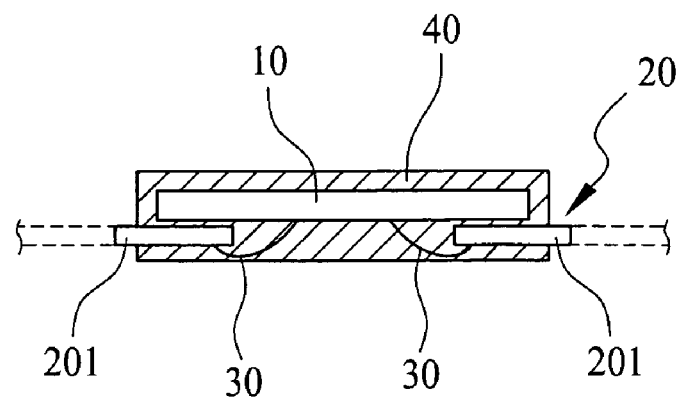
FIG. 1 is the cross section view of the composition and structure of prior art integrated circuits.
Figure 2:
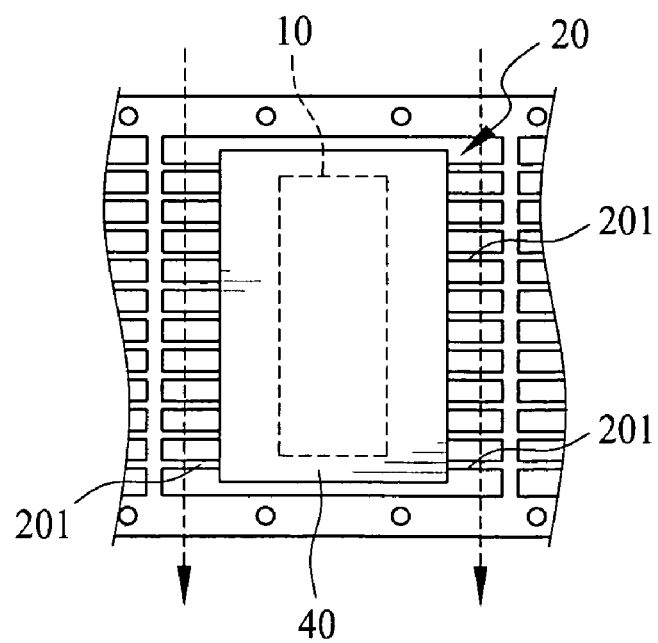
FIG. 2 shows a separation diagram of a prior art integrated circuit with other parts of a leadframe.
Figure 3:
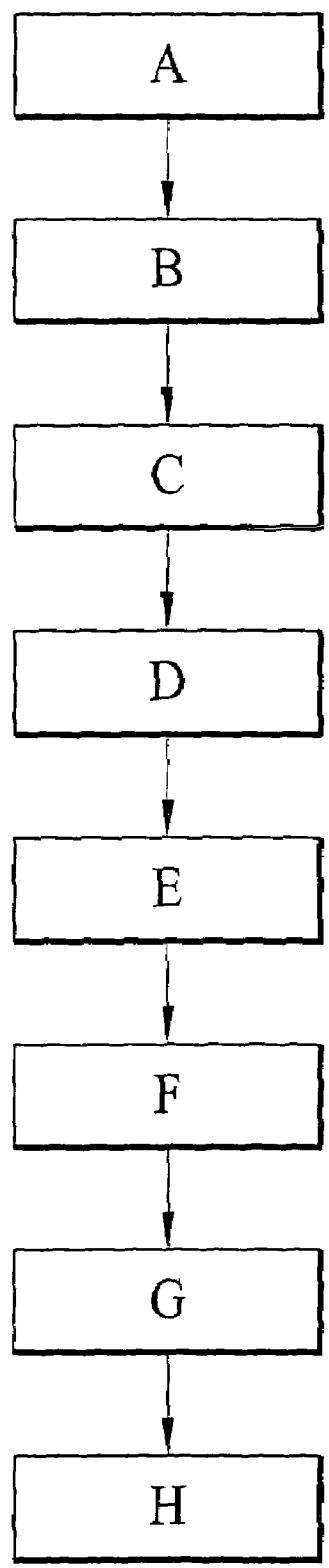
FIG. 3 shows the flow charts for packaging processes for the integrated circuits of the current invention.
Figure 4:
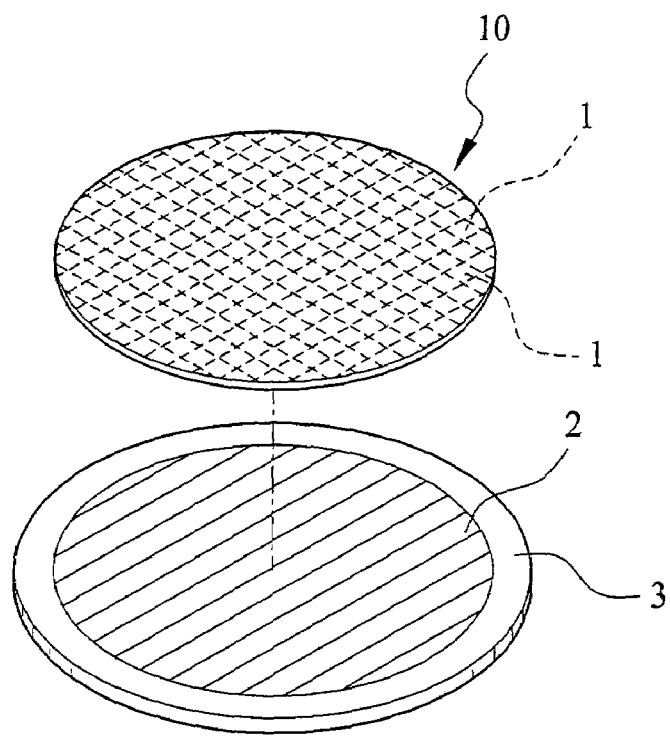
FIG. 4 is the wafer mount process of the current invention.
Figure 5:
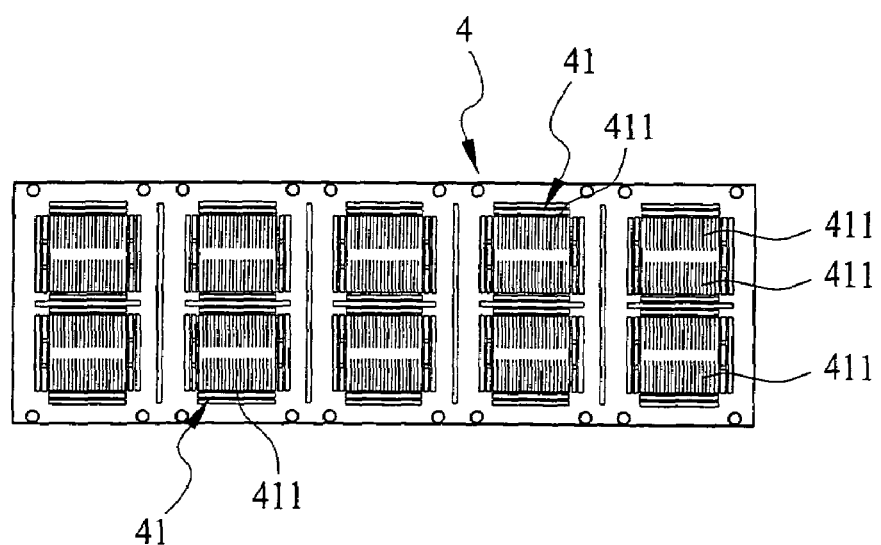
FIG. 5 shows the structure of leadframe and leadframe unit for the current invention.
Figure 6:
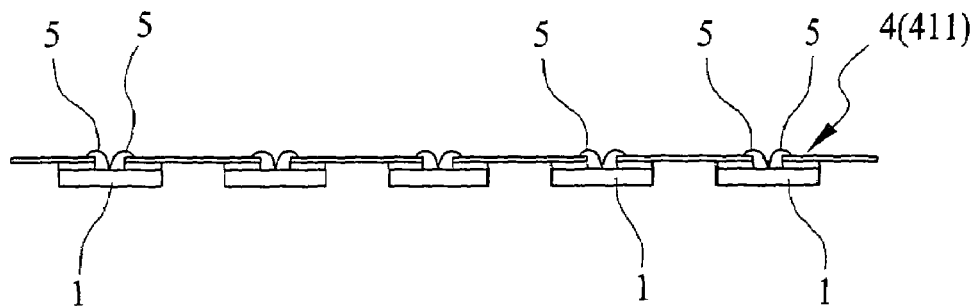
FIG. 6 is the wire-bonding manufacturing process for the current invention.
Figure 7:
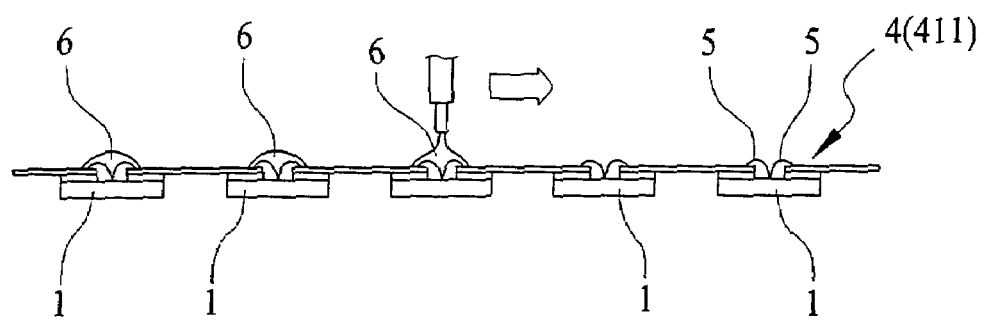
FIG. 7 is the globtopping manufacturing process for the current invention.
Figure 8:
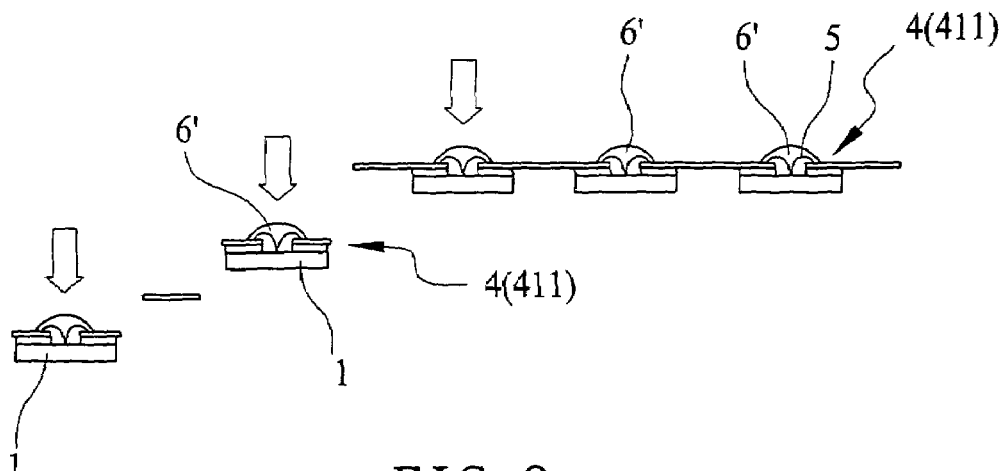
FIG. 8 is the singulating manufacturing process for the current invention.
Figure 9:
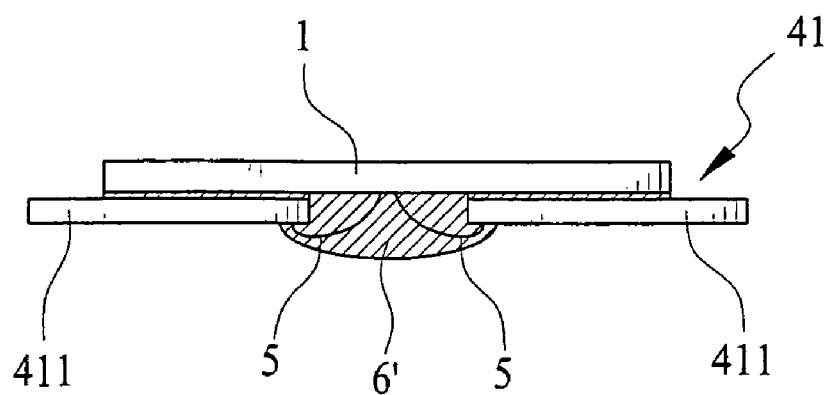
FIG. 9 shows the cross sectional view of the integrated circuits composition and structure for the current invention.
Figure 10:
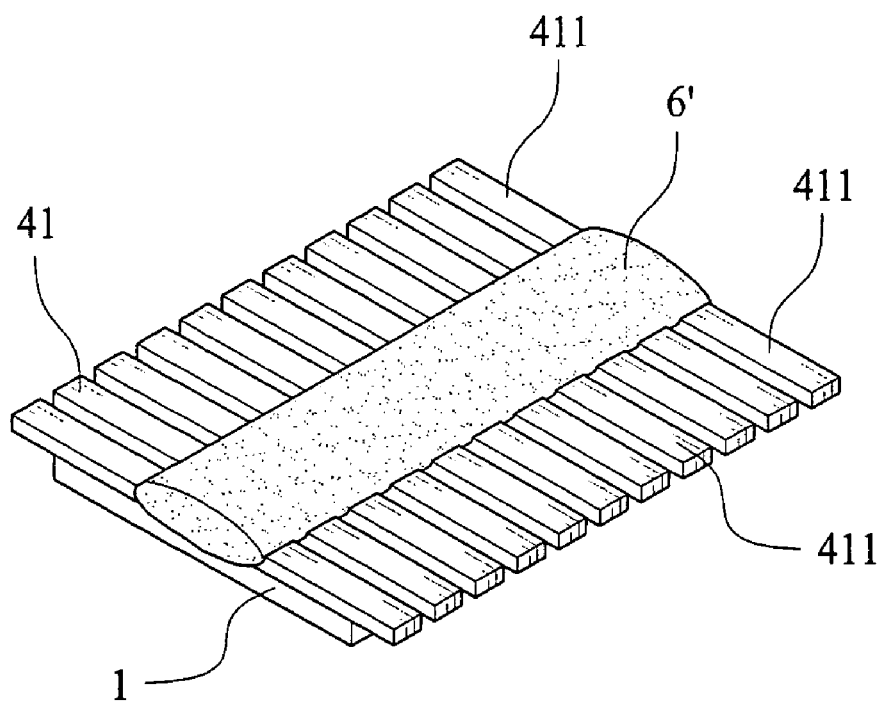
FIG. 10 shows the bottom view stereo drawing of the integrated circuits composition and structure for the current invention.

The structure features and other functions and purposes of this invention will be described in details in the followings accompanied with the embodiments in the attached figures:

As shown in the attached figure, this invention is related to "packaging method of integrated circuit", it could be assembled for electronic products, it is a packaging method and structure design for integrated circuit which possesses special function, please refer to FIG. 3 for its packaging processes, comprising of:

(A) Wafer grinding: Grinding is performed on sliced round wafer 10, its thickness is controlled within product spec; but wafer 10 grinding depends on actual needs, some wafers do not need grinding;

(B) Wafer mount: As shown in FIG. 4, the above-mentioned grinding finished wafer or no-need grinding wafer 10 is temporarily fixed to metal frame 3 (ring) through adhesive 2 (such as blue tape) for further process operations;

(C) Wafer saw: Dicing saw is commonly used to dice the wafer to form multiple independent units of chips 1 temporarily attached to the tape of the metal frame (ring);

(D) Die attach: The singulated chips 1 are transferred to the leadframe units 41 of the leadframe 4 through pick and place device, and chip 1 is attached to leadframe unit 41 through adhesive (such as tape or adhesive glue); for the leadframe 4 and leadframe unit 41, please refer to FIG. 5, thin plate (such as copper plate) is pressed continuously on its surface to form multiple leadframe units 41, each leadframe unit 41 comprising of temporarily un-separated multiple rows of leads 411, these leads 411 are used as out-connecting conducting components for chip 1;

(E) Wire-bonding: As shown in FIG. 6, metal wire 5 (such as gold wire) is wire-bonded to the electrical contacts of chip 1 and the inner end selected spots of leads 411 respectively through wire-bonder such that chip 1 can be connected to outside electrically through leads 411;

(F) Globtopping: Please refer to FIG. 7, metallic wire 5 is used to electrically out-connect chip 1 to outside, liquid type encapsulant material 6 (insulating material) is dispensed continuously to seal the electrical connecting part of metallic wire 5;

(G) Curing: The above dispensed encapsulant 6 is then sent to oven for curing in appropriate temperature, encapsulant 6 is further solidified to form encapsulated body 6', encapsulated body 6' then seal the electrical connecting part of metallic wire 5 (please refer to FIG. 9 and FIG. 10), and the outer ends of leads 411 of the leadframe unit 41 are then exposed;

(H) Saw: Please refer to FIG. 8, saw or punching process with dicing wheel or punching tool can then be applied to the packaged products to cut away unwanted material at the outer ends of leads 411 of leadframe unit 41, and each independent unit is thus separated, each integrated circuit unit comprising of chip 1, leadframe unit 41, leads 411, metallic wire 5 and encapsulated body 6', it can be used in specific electronic product;

The integrated circuit structure of the current invention, through the above-mentioned packaging method and design, as shown in FIGS. 9 and 10, comprising a specific function die 1 (chip), at its bottom is a leadframe unit 41 with multiple rows of leads 411, metallic wire 5 is used between chip 1 and leads 411 as electrical connection, the electrical connecting part of metallic wire 5 is sealed with encapsulated body 6', the outer ends and bottom surfaces of leads 411 are used as connecting part to the printed circuit board, it thus forms integrated circuit which can be applied and soldered to all kinds of electronic products.

The disclosed "globtopping" (F) process for the current invention is to use liquid encapsulant material 6 melted to certain viscosity and dispense it directly to seal the electrical connecting part of metallic wire 5, then it is solidified to form encapsulated body 6' through curing at appropriate temperature, the encapsulated body 6' can thus protect the electrical connecting part of metallic wire 5; through the embodiment of this process, it can save the use of prior art molding equipment, and the goals of easy manufacturing processes, fast production, lowered production cost, easy-to-control integrated circuit quality, suitability for mass production can thus be achieved. Furthermore, since in the "singulation" (H) process of the current invention, we use punch tool to punch independent unit of integrated circuit, and get away the excess material of leadframe 4, therefore, through the design of punching mold, we can punch multiple integrated circuits at a time, this can improve the prior art which dice the die one by one, and the manufacturing of integrated circuit products can thus be speeded up, this is a process very suitable for mass production.

Figure 11:
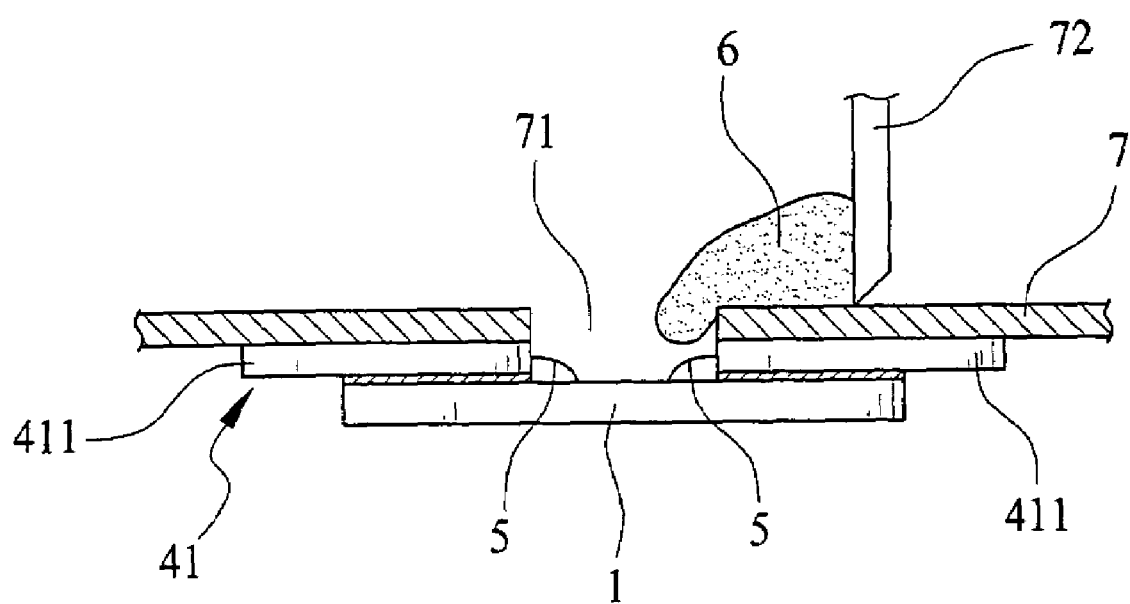
FIG. 11 shows the embodiment of encapsulant dispensing for the current invention.

We also have to point out, the "globtopping" (F) process disclosed in this invention can also be embodied by "coating" method, please refer to FIG. 11, it is to first embody wire-bonding on one side of the chip 1 to form electrical out-connecting part (surface), then a plate 7 is covered in advance, the plate 7 has at least an opening 71 corresponding to the electrical out-connecting part of metallic wire 5, therefore, encapsulant material 6 can be placed above the plate 7, then a scrape blade 72 can be used to transfer encapsulant material 6 to fill the opening 71, encapsulant material therefore seal the electrical connecting part of the metallic wire, then plate 7 is taken away, a "curing" (G) process is embodied, a structure where encapsulated body 6' seal the electrical connecting part of metallic wire 5 is thus formed other later process such as singulation (H), etc., can thus be performed independent unit of integrated circuit can thus be produced; therefore, a manufacturing method adopting plate 7 accompanied with scrape blade 72 for "coating" can avoid the use of prior art Transfer Mold equipment and tooling, the goals of easy manufacturing processes, fast production, lowered production cost, easy-to-control integrated circuit quality, suitability for mass production can thus be achieved.

Summarize the above descriptions, current invention of "Packaging method for integrated circuits" does possess the required properties of utility and invention, its embodiments are also inventive, we therefore submit a new type patent application.

What the invention claimed is:

1. A method for manufacturing integrated circuits, which comprises the steps of:
   a) removably adhering a wafer to a metal frame utilizing an adhesive;
   b) dicing the wafer into a plurality of chips;
   c) removing the plurality of chips from the metal frame and attaching one of the plurality of chips to each of a plurality of lead frame units of a lead frame;
   d) wire-bonding the electrical contacts of one of the plurality of chips to a plurality of leads of each of the plurality of lead frame units utilizing a plurality of metal wires;
   e) applying an encapsulant material over the plurality of metal wires of connected to each of the plurality of lead frame units;
   f) curing the encapsulant material to form an encapsulated body, opposing ends and bottoms of the plurality of leads of each of the plurality of lead frame units extend outwardly from the encapsulated body; and
   g) forming a plurality of integrated circuit units by separating each of the plurality of lead frame units and removing selected portions of the lead frame, each of the plurality of integrated circuit units includes a chip electrically connected to the plurality of leads of one of the plurality of lead frame units utilizing a plurality of metal wires encapsulated by the encapsulated body.

2. The method according to claim 1, wherein the applying step e) includes covering the lead frame with a plate having at least one hole aligning with selected metal wires of at least one of the lead frame units, applying the encapsulant material to a surface of the plate, and filling the at least one hole and encapsulating the selected metal wires with the encapsulant material by utilizing a scrap blade making a top surface of the encapsulant flat.

3. The method according to claim 1, wherein the mounting step a) is preceded by grinding the wafer to a predetermined thicknesses.

* * * * *